United States Patent
Rha (10) Patent No.: US 7,990,777 B2
(45) Date of Patent: Aug. 2, 2011

(54) METHOD, APPARATUS AND SYSTEM FOR TRANSMITTING DATA IN SEMICONDUCTOR DEVICE

(75) Inventor: Kyoung-seok Rha, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 412 days.

(21) Appl. No.: 12/122,755

(22) Filed: May 19, 2008

(65) Prior Publication Data

US 2009/0147882 A1 Jun. 11, 2009

(30) Foreign Application Priority Data

Dec. 7, 2007 (KR) .................. 10-2007-0126894

(51) Int. Cl.
*G11C 7/06* (2006.01)

(52) U.S. Cl. .......... 365/189.07; 365/189.08; 365/189.09

(58) Field of Classification Search ............. 365/189.07, 365/189.08, 189.09, 207, 210, 189.17, 189.06
See application file for complete search history.

(56) References Cited

U.S. PATENT DOCUMENTS

| 6,826,129 | B1 * | 11/2004 | Matsuura | 369/13.14 |
| 7,269,699 | B2 * | 9/2007 | Jang | 711/154 |
| 7,304,898 | B2 * | 12/2007 | Lee et al. | 365/193 |
| 7,411,840 | B2 * | 8/2008 | Gaskins et al. | 365/189.07 |
| 2006/0150044 | A1 * | 7/2006 | Lee et al. | 714/736 |
| 2007/0115733 | A1 * | 5/2007 | Jang et al. | 365/189.07 |

* cited by examiner

*Primary Examiner* — Dang T Nguyen
(74) *Attorney, Agent, or Firm* — Sughrue Mion, PLLC (57) ABSTRACT

Provided is a method of inverting data that is to be transmitted and transmitting the data in a semiconductor device. The method includes inverting bits of data that is to be transmitted if the number of bit transitions of previously transmitted data and the data that is to be transmitted among sequentially transmitted data exceeds a reference number; indicating in any one of a plurality of data strobe signals that the data that is to be transmitted is inverted; and transmitting the data strobe signal indicating that the data that is to be transmitted is inverted and the inverted data.

22 Claims, 6 Drawing Sheets

FIG. 1A (RELATED ART)

| $t_0$ | $t_1$ | TRANSITION |
|---|---|---|
| 1 | 0 | Y |
| 0 | 1 | Y |
| 0 | 1 | Y |
| 1 | 1 | N |
| 1 | 0 | Y |
| 1 | 0 | Y |
| 1 | 1 | N |
| 0 | 1 | Y |

FIG. 1B (RELATED ART)

| $t_0$ | $t_1$ | TRANSITION |
|---|---|---|
| 1 | 1 | N |
| 0 | 0 | N |
| 0 | 0 | N |
| 1 | 0 | Y |
| 1 | 1 | N |
| 1 | 1 | N |
| 1 | 0 | Y |
| 0 | 0 | N |

| DATA SEQUENCE | DATA | | NUMBER OF BIT TRANSITIONS |
|---|---|---|---|
| 1 | FF | 1111 1111 | |
| 2 | 00 | 0000 0000 | 8 |
| 3 | F8 | 1111 1000 | 5 |
| 4 | C8 | 1100 1000 | 2 |
| 5 | 07 | 0000 0111 | 6 |
| 6 | 00 | 0000 0000 | 3 |
| 7 | FF | 1111 1111 | 8 |
| 8 | ED | 1110 1101 | 2 |
| TOTAL NUMBER OF BIT TRANSITIONS | | | 34 |

| DATA SEQUENCE | DATA | | NUMBER OF BIT TRANSITIONS |
|---|---|---|---|
| 1 | FF | 1111 1111 | |
| 2 | FF | 1111 1111 | 0 |
| 3 | F8 | 1111 1000 | 3 |
| 4 | C8 | 1100 1000 | 2 |
| 5 | F8 | 1111 1000 | 2 |
| 6 | FF | 1111 1111 | 3 |
| 7 | FF | 1111 1111 | 0 |
| 8 | ED | 1110 1101 | 2 |
| TOTAL NUMBER OF BIT TRANSITIONS | | | 12 |

FIG. 8

METHOD, APPARATUS AND SYSTEM FOR TRANSMITTING DATA IN SEMICONDUCTOR DEVICE

CROSS-REFERENCE TO RELATED PATENT APPLICATIONS

This application claims priority from Korean Patent Application No. 10-2007-0126894 filed on Dec. 7, 2007, in the Korean Intellectual Property Office, the disclosure of which is incorporated herein in its entirety by reference.

BACKGROUND OF THE INVENTION

1. Field of the Invention

Apparatuses and methods consistent with the present invention relate to transmitting data in a semiconductor device, and more particularly, to inverting data that is to be transmitted and transmitting the data.

2. Description of the Related Art

When semiconductor devices read or write data, transition of bits of sequentially transmitted data occurs. For example, if data "1111 0111" was previously transmitted, and data "1110 0110" is subsequently transmitted, transition of the fourth and eighth bit occurs. A frequent transition of bits increases power consumption of memory devices according to the input/output of data. Bus encoding has been used to solve the above problem. Examples of bus encoding include binary encoding, one-hot encoding, gray code encoding, bus-invert encoding, working zone encoding, limited weight coding, and the like. The bus invert encoding comprises inverting data that is subsequently transmitted to reduce a Hamming distance, which is a difference between data that was previously transmitted and the data that is subsequently transmitted, via a bus if the Hamming distance exceeds a predetermined reference amount. In more detail, if transmission of bit-wise inverted data results in less of a bus change than transmission of data that is not bit-wise inverted, the bus invert encoding transmits the bit-wise inverted data. The bus invert encoding produces a least possible change in data values in buses, which reduces a number of changes in bus lines during the transmission of data, thereby reducing a dynamic power consumption of buses.

Figure 1A:
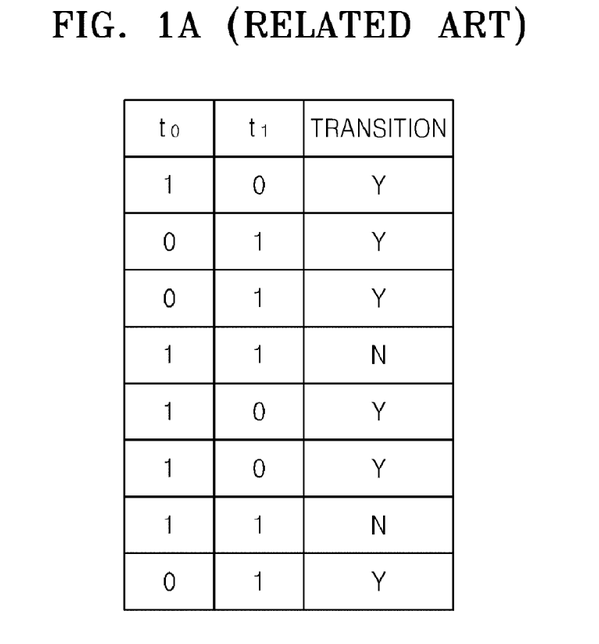
FIGS. 1A and 1B illustrate examples of bus invert encoding in the related art.
Figure 1B:
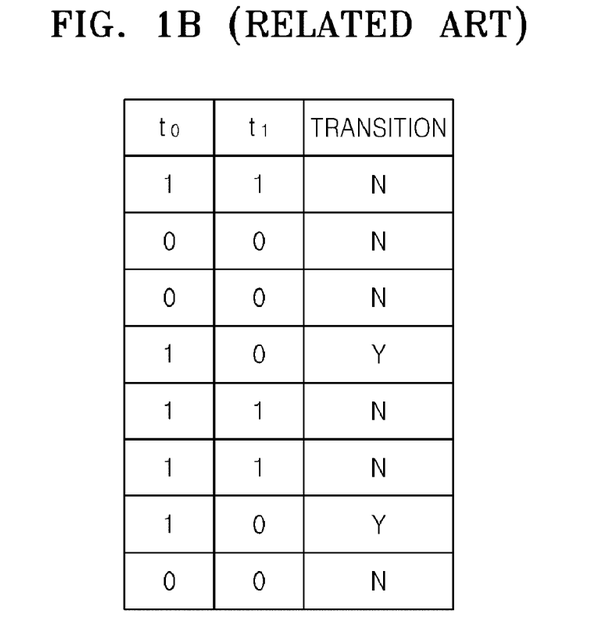

FIGS. 1A and 1B illustrate examples of bus invert encoding in the related art. Referring to FIG. 1A, data "1001 1110" is transmitted (at time $t_0$), and data "0111 0011" is transmitted later (at time $t_1$:$t_0$<$t_1$). Comparing both sets of data, six transitions of bits occur. Referring to FIG. 1B illustrating a result of performing the bus invert encoding, inverted bits of the data that is to be transmitted is "1000 1100". In comparison with the data "1001 1110" at time $t_0$ and the data "1000 1100" inverted at time $t_1$, only two transitions of bits occur. That is, bit transition is reduced to a quarter of that of FIG. 1A wherein the bus invert encoding is not performed.

Modern semiconductor memory devices operate at high speed, are capable of mass-storage, and are low-priced owing to the development of related technologies. In particular, great progress in a data processing speed of memory has been made. Therefore, when data is transmitted, bit transition of data frequently occurs due to a high frequency in data buses. Such frequent data transition causes great power consumption, making it impossible to operate an optimized system. Furthermore, a high operating frequency has a bad effect in terms of electromagnetic interference (EMI).

SUMMARY OF THE INVENTION

The present invention provides a method, apparatus, and system for transmitting data in a semiconductor device so as to reduce the number of bit transitions via inverse encoding that uses an address signal and a data strobe signal.

According to an aspect of the present invention, there is provided a method of transmitting data in a semiconductor device, the method comprising: inverting bits of data that is to be transmitted if the number of bit transitions of previously transmitted data and the data that is to be transmitted among sequentially transmitted data exceeds a reference number; indicating in any one of a plurality of data strobe signals that the data that is to be transmitted is inverted; and transmitting the data strobe signal indicating that the data that is to be transmitted is inverted and the inverted data.

The method may further comprise: setting a specific bit of an address signal as a control bit, wherein bits of the data that is to be transmitted are inverted according to the control bit.

The address signal may be a column address strobe (CAS) signal.

The inverting of the bits of the data that is to be transmitted may comprise: storing the previously transmitted data among the sequentially transmitted data; comparing the stored data with the data that is to be transmitted; and inverting bits of the data that is to be transmitted if the number of bit transitions of the stored data and the data that is to be transmitted exceeds a reference value.

The reference value is that the number of bit transitions of the stored data and the data that is to be transmitted is half the total number of bits of one of the stored data and the data that is to be transmitted.

According to another aspect of the present invention, there is provided a data transmitting apparatus comprising: an inversion determining unit inverting bits of data that is to be transmitted if the number of bit transitions of previously transmitted data and the data that is to be transmitted among sequentially transmitted data exceeds a reference number; an inversion indicating unit indicating in any one of a plurality of data strobe signals that the data that is to be transmitted is inverted; and a transmitting unit transmitting the data strobe signal indicating that the data that is to be transmitted is inverted and the inverted data.

The apparatus may further comprise: a control bit setting unit setting a specific bit of an address signal as a control bit, wherein bits of the data that is to be transmitted are inverted according to the control bit.

The inversion determining unit may comprise: a buffer storing the previously transmitted data among the sequentially transmitted data; a comparator comparing the stored data with the data that is to be transmitted; and an inverter inverting bits of the data that is to be transmitted if the number of bit transitions of the stored data and the data that is to be transmitted exceeds a reference value.

According to another aspect of the present invention, there is provided a method of transmitting data in a semiconductor system comprising: a first device inverting bits of data that is to be transmitted if the number of bit transitions of previously transmitted data and the data that is to be transmitted among sequentially transmitted data exceeds a reference number; the first device indicating in any one of a plurality of data strobe signals that the data that is to be transmitted is inverted; the first device transmitting the data strobe signal indicating that the data that is to be transmitted is inverted and the inverted data; and if a second device receives the data strobe signal indicating that the data that is to be transmitted is inverted and the inverted data, the second device inverting bits of the received data again based on the received data strobe signal.

When a memory controller transmits a write command to a semiconductor memory device, the first device is included in the memory controller, and the second device is included in the semiconductor memory device.

When a memory controller transmits a read command to the semiconductor memory device, the first device is included in the semiconductor memory device, and the second device is included in the memory controller.

According to another aspect of the present invention, there is provided a data transmitting system comprising: a first device including an inversion determining unit inverting bits of data that is to be transmitted if the number of bit transitions of previously transmitted data and the data that is to be transmitted among sequentially transmitted data exceeds a reference number; an inversion indicating unit indicating that the data that is to be transmitted is inverted in any one of a plurality of data strobe signals; and a transmitting unit transmitting the data strobe signal indicating that the data that is to be transmitted is inverted and the inverted data; and a second device including, if the data strobe signal indicating that the data that is to be transmitted is inverted and the inverted data are received via a bus, a first inverter re-inverting bits of the received data again based on the received data strobe signal.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS OF THE INVENTION

Hereinafter, exemplary embodiments of the present invention will be described in detail with reference to the accompanying drawings.

Figure 2:
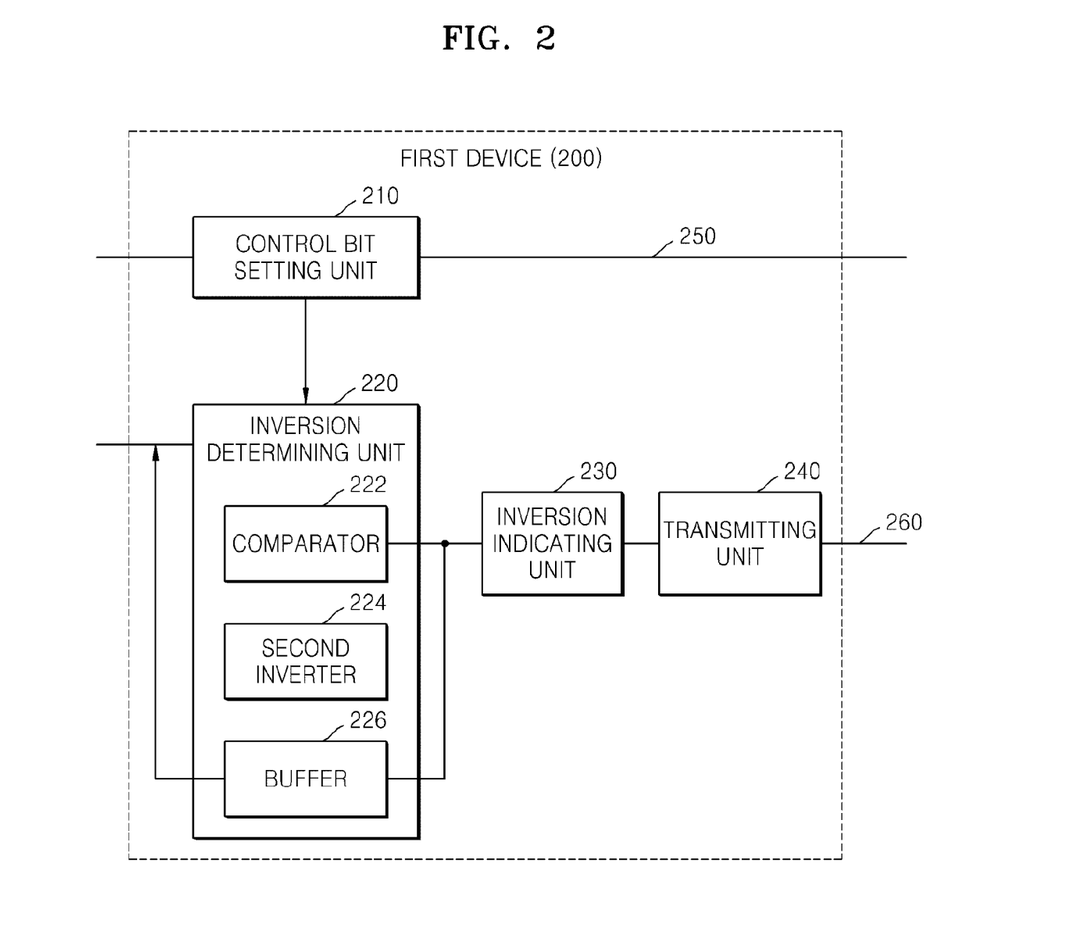
FIGS. 2 and 3 are block diagrams of a first device and a second device included in a semiconductor system according to an exemplary embodiment of the present invention.
Figure 3:
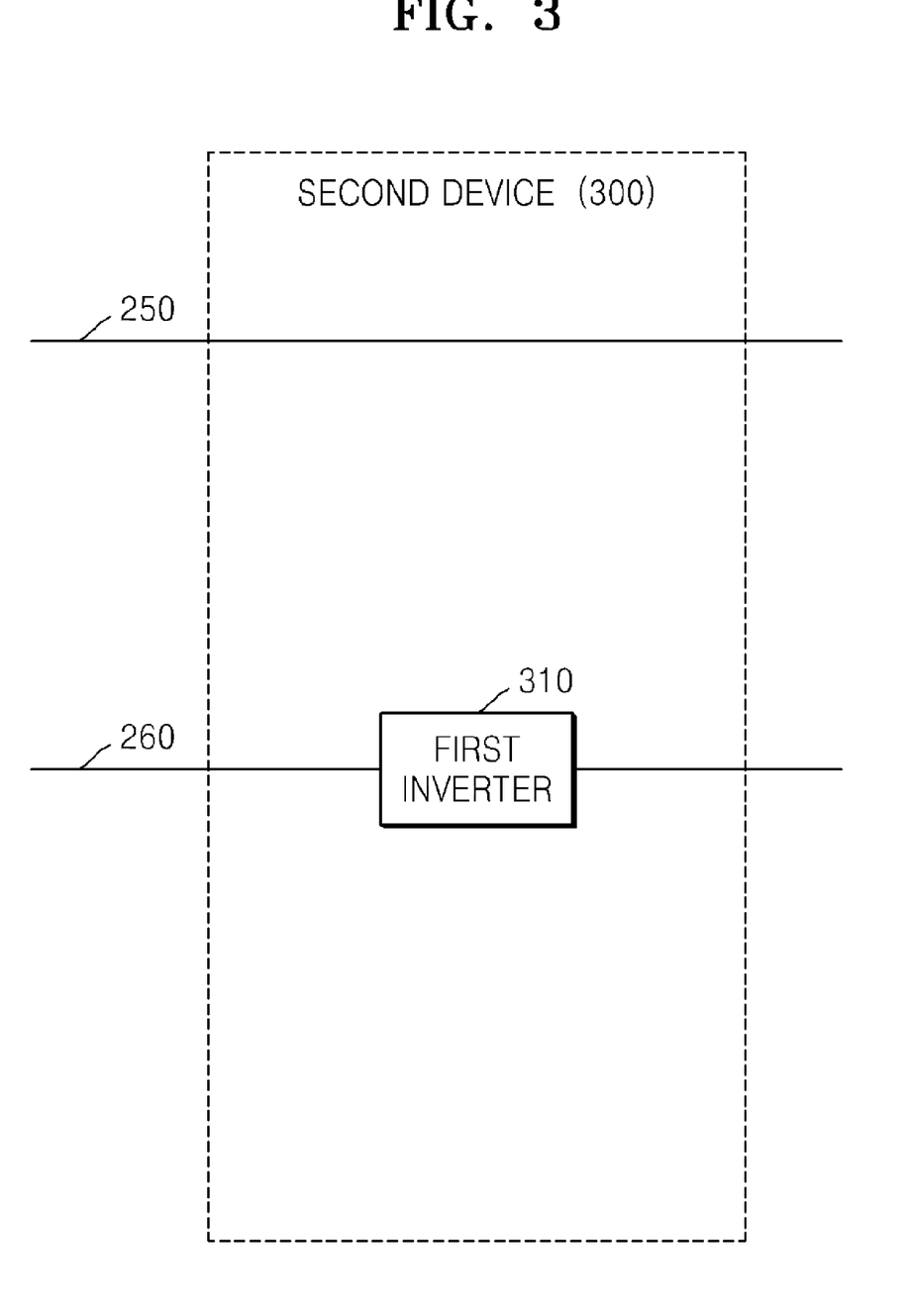

FIGS. 2 and 3 are block diagrams of a first device 200 and a second device 300 included in a semiconductor system according to an exemplary embodiment of the present invention. Referring to FIGS. 2 and 3, the semiconductor system comprises the first device 200 that inverts data and transmits the data, and the second device 300 that inverts the inverted data received from the first device 200 again in order to reconstruct the inverted data to the original data. The first device 200 comprises a control bit setting unit 210, an inversion determining unit 220, an inversion indicating unit 230, and a transmitting unit 240. The second device 300 comprises a first inverter 310. The inversion determining unit 220 comprises a comparator 222, a second inverter 224, and a buffer 226. The first and second devices 200 and 300 are connected to each other via an address bus 250 and a data bus 260.

The control bit setting unit 210 of the first device 200 sets a specific bit of an address signal as a control bit. The control bit is used to control a data inversion operation. For example, the first device 200 does not invert data if the control bit is "0", and inverts the data and transmits the data if the control bit is "1". Alternatively, in another exemplary embodiment of the present invention, if the control bit is "0", the first device 200 may invert data and transmit the data, and if the control bit is "1", the first device 200 may not invert the data, all which is set by a memory controller. If the control bit is "1", the first device 200 inverts the data in the present invention. The address signal is used to determine whether to select a memory cell, i.e., designating an address of a memory. In a dynamic random access memory (DRAM), a memory cell array includes rows and columns. Therefore, a signal is additionally required to classify rows and columns when an address of a memory is designated. The signal includes a row address strobe (RAS) which is a strobe signal used to receive a row address and a column address strobe (CAS) which is a strobe signal used to receive a column address. For example, Table 1 below shows addresses of a semiconductor memory double data rate 2 (DDR2) device.

TABLE 1

| | Device | | | | |
|---|---|---|---|---|---|
| | 16 Mb * 16 | 32 Mb * 16 | 64 Mb * 16 | 128 Mb * 16 | 256 Mb * 16 |
| Bank Address | BA[1:0] | BA[1:0] | BA[2:0] | BA[2:0] | BA[2:0] |
| Row Address | A[12:0] | A[12:0] | A[12:0] | A[13:0] | A[14:0] |
| Column Address | A[9:0] | A[8:0] | A[9:0] | A[9:0] | A[9:0] |

Table 1 is an address table of DDR2 devices. The devices have a data bit width of 16. Referring to Table 1, the device 32 Mb*16 has a bit width of 16. A bank is a single independent cell array. A bit width of the column address is smaller than that of the row address. For example, in device 16 Mb*16, a bit width of the column address is fewer by 3 than that of the row address. A column address A[10] has more than one extra bit although it is used for auto per charge. In more detail, one bit of the address signal can be used differently when DDR2 devices send the column address in order to perform a reading/writing operation. In an exemplary embodiment, one extra bit of the column address signal is used as the control bit. In the present invention, the semiconductor memory is not limited to the DDR2 devices.

Figure 4:
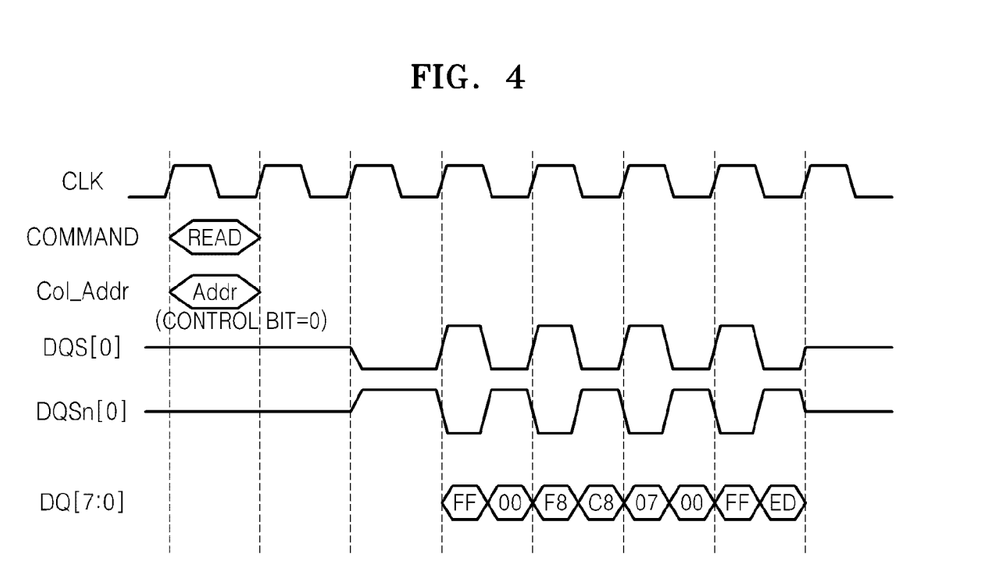
FIG. 4 is a waveform diagram illustrating a reading operation when a control bit is 0 according to an exemplary embodiment of the present invention.

FIG. 4 is a waveform diagram illustrating a reading operation when a control bit is 0 according to an exemplary embodiment of the present invention. In more detail, FIG. 4 is an exemplary waveform of various signals of a DDR2 device. Referring to FIG. 4, command is used to determine how to operate a memory, which is a read command for reading data. If the read command is input, after a predetermined period of time passes, data information of a memory cell selected according to address information is output from the memory. In Col_Addr, the control bit is 0. In this case, the data is not inverted but is normally transmitted. Data strobe signals DQS and DQSn are used to read a transmitted data signal at predetermined time intervals. In the waveform, the data strobe signals DQS and DQSn operate normally. DQ denotes data. In the data strobe signal DQS, the data is transmitted at both rising and falling edges.

Figure 5:
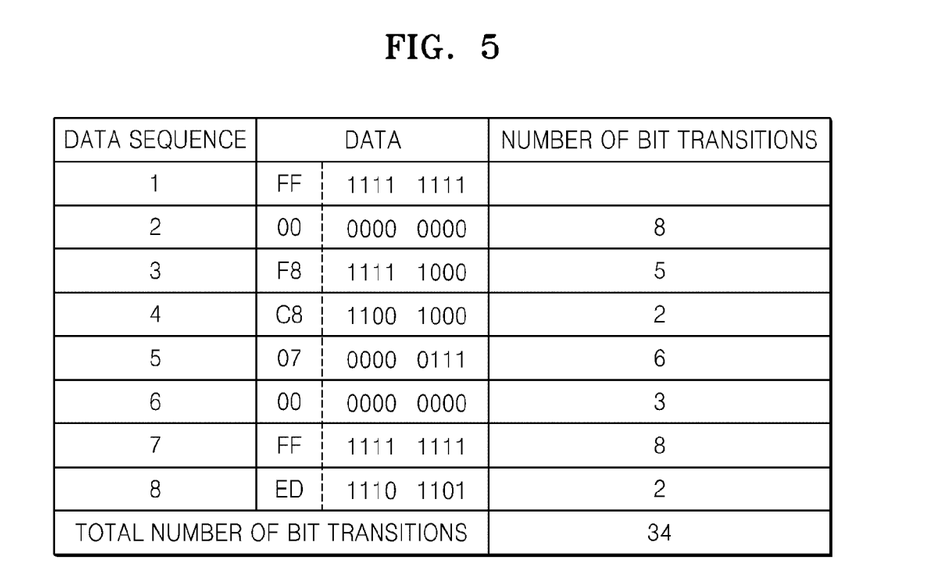
FIG. 5 is a table illustrating the number of bit transitions of data shown in FIG. 4.

FIG. 5 is a table illustrating the number of bit transitions of the data shown in FIG. 4. Referring to FIG. 5, first data "FF" is expressed as binary numbers "1111 1111". Second data "00" is expressed as binary numbers "0000 0000". Therefore, both first data and second data have eight bit transitions between "1" to "0" or between "0" to "1". The total number of bit transitions of the data is 34 in FIG. 5.

If a control bit is "1", bits of data are inverted and transmitted.

Figure 6:
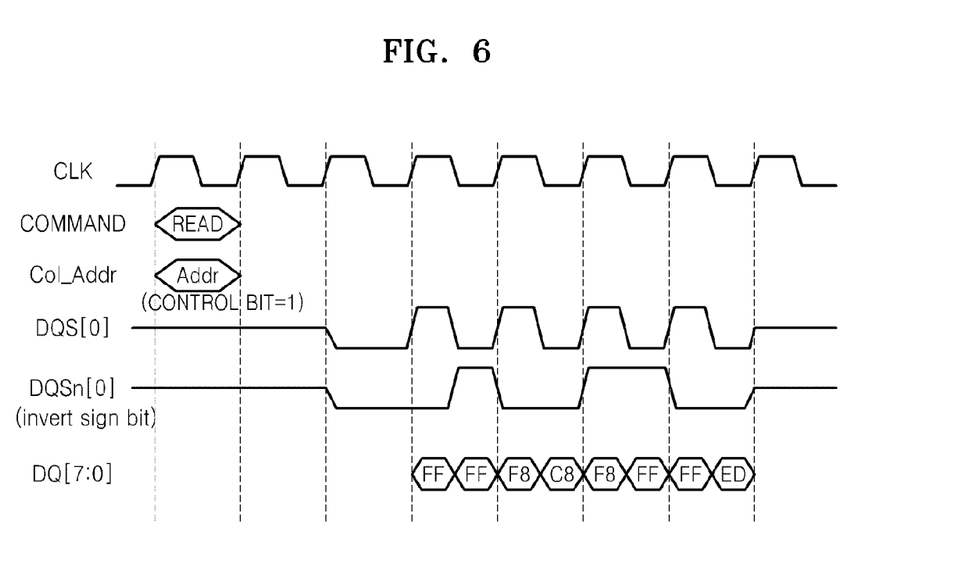
FIG. 6 is a waveform diagram illustrating a reading operation when a control bit is 1 according to an exemplary embodiment of the present invention.
Figure 7:
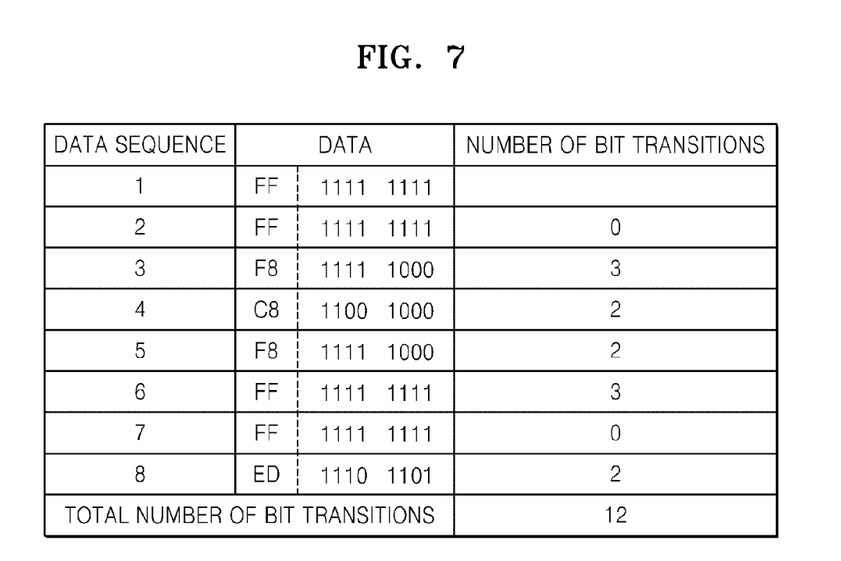
FIG. 7 is a table illustrating the number of bit transitions of data shown in FIG. 6.

FIG. 6 is a waveform diagram illustrating a reading operation when a control bit is 1 according to an exemplary embodiment of the present invention. FIG. 7 is a table illustrating the number of bit transitions of data shown in FIG. 6. In more detail, FIG. 6 illustrates exemplary waveforms of various signals of a DDR2 device.

Referring to FIG. 6, a clock signal CLK and a command are the same as those in FIG. 4. In Col_Addr, since the control bit is 1, bits of data are inverted. A detailed description of FIGS. 6 and 7 will be given later.

The inversion determining unit 220 inverts bits of data that is to be transmitted if the number of bit transitions of previous data and the data that is to be transmitted from among data that is sequentially transmitted exceeds a reference value.

The buffer 226 temporarily stores the transmitted data. For example, if the first data "FF" shown in FIG. 5 is transmitted, the "FF" is temporarily stored. If the second data "00" is transmitted, the "00" is temporarily stored. The buffer 226 can be implemented as a D-flip-flop.

The comparator 222 compares the data that is previously transmitted and stored in the buffer 226 with the data that is to be transmitted. If the second data shown in FIG. 5 is transmitted, the comparator 222 compares the data "FF" stored in the buffer 226 with the current data "00". The number of bit transitions of the data is eight. The inversion of data may be determined when the number of inverted bits of the data exceeds half the total number of bits of the data. Such a determination can be made by a memory controller. In an exemplary embodiment of the present invention, since the total number of bits is eight, if the number of inverted bits is five and over, the second inverter 224 inverts bits of the data. Referring to FIGS. 5 and 7, since the number of bit transitions of the second data "0000 0000" and the first data "1111 1111" is eight, the second inverter 224 inverts the second data "0000 0000" to "1111 1111". Referring to FIG. 5, since the number of bit transitions of the second data "0000 0000" and the third data "1111 1000" is five, the inversion of bits of the above data is erroneous. The buffer 226 does not store original data but stores inverted and transmitted data. That is, referring to FIG. 7, it is necessary to compare the inverted second data "1111 1111" with the third data "1111 1000". In this regard, since the number of bit transitions is three, the third data is not inverted. Referring to FIGS. 5 and 7, the fifth data and the sixth data are inverted. The total number of bit transitions is thirty-four in FIG. 5, whereas the total number of bit transitions is twelve in FIG. 7 when bits of data are inverted.

The inversion indicating unit 230 indicates by using any one of a plurality of data strobe signals DQS that the data that is to be transmitted is inverted. In the DDR2 device, a differential data strobe mode is used. Two lines having an opposite signal level are used. Referring to FIG. 6, data strobe signal DQSn is used as sign signal. Since the data strobe signal DQSn is "1" in the second, fifth, and sixth data, the above data is inverted. However, the inversion of the above data may be previously indicated by the memory controller. If the data strobe signal DQSn is "0", it may be indicated that data is inverted.

The transmitting unit 240 transmits the indicating data strobe signal and the inverted data via the data bus 260.

When the first inverter 310 of the second device 300 receives the indicating data strobe signals and the inverted data via the data bus 260, the first inverter 310 inverts bits of the received data again based on the indicating data strobe signals. That is, if the data strobe signal is "1", the first inverter 310 inverts the inverted data again so as to reconstruct the original data.

When the memory controller transmits a write command to a semiconductor memory device, the first device 200 is included in the memory controller, and the second device 300 is included in the semiconductor memory device. To the contrary, when the memory controller transmits a read command to the semiconductor memory device, the first device 200 is included in the semiconductor memory device, and the second device 300 is included in the memory controller.

Figure 8:
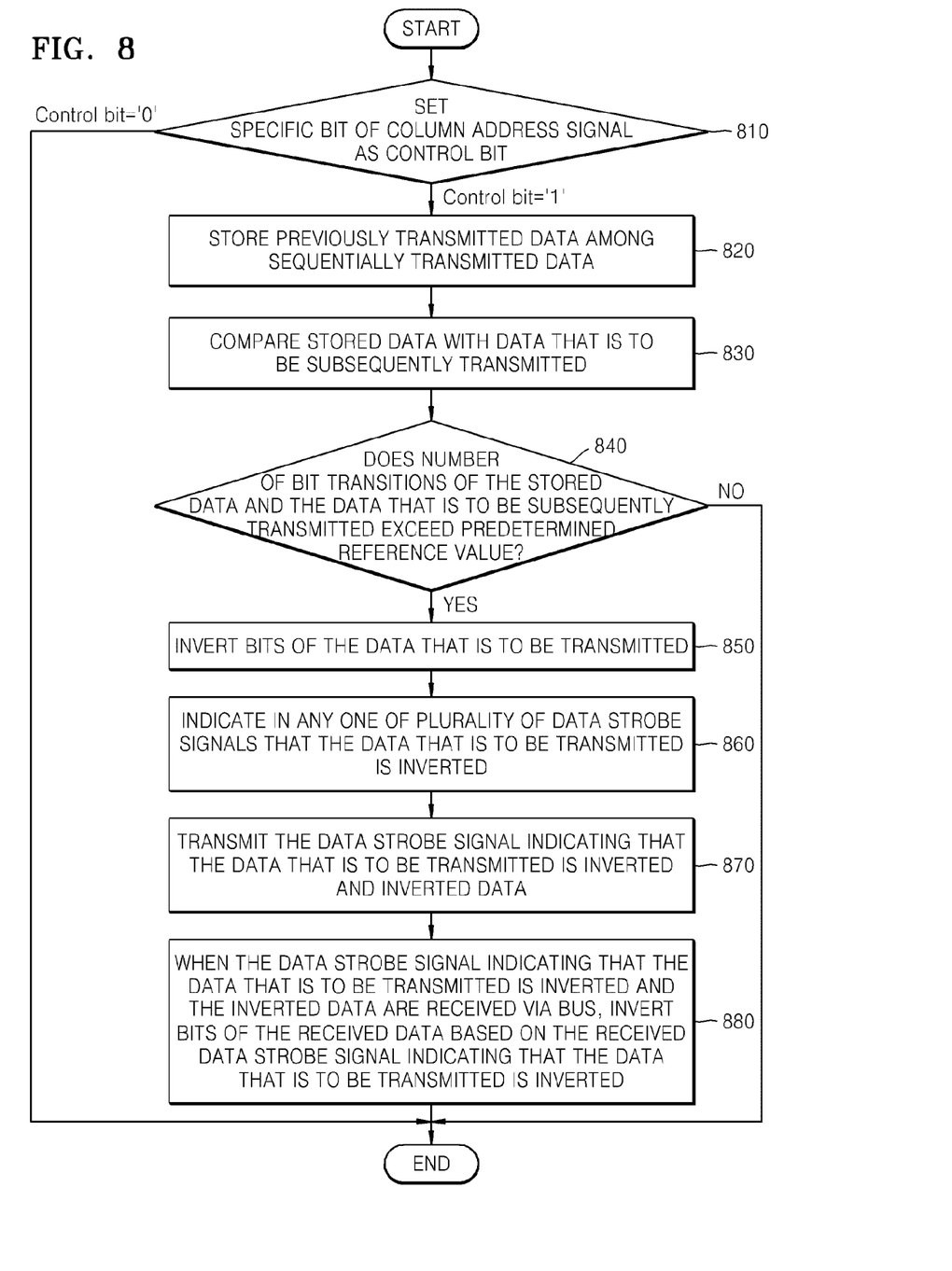
FIG. 8 is a flowchart illustrating a method of inverting and transmitting data in a semiconductor system according to an exemplary embodiment of the present invention.

FIG. 8 is a flowchart illustrating a method of inverting and transmitting data in a semiconductor system according to an exemplary embodiment of the present invention. Referring to FIG. 8, the semiconductor system sets a specific bit of a column address signal as a control bit (operation 810). The column address signal that is transmitted via the address bus 250 has extra bits that are to be used as control bits, unlike the case with a row address signal. One of extra bits is set as the control bit used to perform an inversion operation. When the control bit is "1", the inversion operation is performed, whereas when the control bit is "0", the inversion operation is not performed. However, the present invention is not limited thereto and the inversion operation may be performed when the control bit is "0", and the inversion operation may not be performed when the control bit is "1".

The semiconductor system stores previously transmitted data among sequentially transmitted data (operation 820). The transmitted data is fed back and stored in the buffer 226.

The semiconductor system compares the stored data with data that is to be subsequently transmitted (operation 830).

The semiconductor system determines whether the number of bit transitions of the stored data and the data that is to be subsequently transmitted exceeds a predetermined reference value (operation 840). That is, it is determined whether a Hamming distance, a difference between the previously transmitted data and the data that is to be subsequently transmitted via a bus, exceeds a reference value. For example, if the stored data is "1111 0000" and the data that is to be subsequently transmitted is "1000 0011", the Hamming distance is five. In present exemplary embodiment, the reference value is the number of bit transitions that exceeds one-half of the total number of bits of the data. In this case, since the number of bit transitions is five, and the total number of bits of data is eight, the number of bit transitions exceeds the majority of the total number of bits of data.

If the number of bit transitions of both data exceeds the reference value, the semiconductor system inverts bits of the data that is to be transmitted (operation 850). In the above example, the data "1000 0011" that is to be subsequently transmitted is inverted. Then, the inverted data that is to be subsequently transmitted undergoes a transition to "0111 1100". In this regard, since the number of bit transitions is three, the number of bit transitions is reduced by two, compared to the number of bits of the stored data.

The semiconductor system indicates in any one of a plurality of data strobe signals that the data that is to be transmitted is inverted (operation 860). A sign signal is used to indicate that the data that is to be transmitted is inverted in any one of the plurality of data strobe signals DQS. A data strobe signal of a section corresponding to the inverted data is set as "1".

The semiconductor system transmits the data strobe signal indicating that the data that is to be transmitted is inverted and the inverted data (operation 870).

When a receiving device receives the data strobe signal indicating that the data that is to be transmitted is inverted and receives the inverted data via a data bus, the receiving device inverts bits of the received data based on the received data strobe signal indicating that the data that is to be transmitted is inverted, so as to reconstruct original data (operation 880).

Meanwhile, the present invention can also be embodied as computer readable code on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices. The computer readable recording medium can also be distributed over network coupled computer systems so that the computer readable code is stored and executed in a distributed fashion.

An inverse encoding method that uses a data strobe signal and an address signal is applied to the operation of a semiconductor memory device, thereby reducing the number of bit transitions of data, thus reducing power consumption.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation. Therefore, the scope of the invention is defined not by the detailed description of the invention but by the appended claims, and all differences within the scope will be construed as being included in the present invention.

What is claimed is:

1. A method of transmitting data in a semiconductor device, the method comprising:
    inverting at least one bit of data that is to be transmitted if a number of bit transitions between stored previously transmitted data and the data that is to be transmitted of sequentially transmitted data exceeds a reference number; indicating in a data strobe signal of a plurality of data strobe signals that the at least one bit of the data that is to be transmitted is inverted; and
    transmitting the data strobe signal and the data of which the at least one bit is inverted,
    wherein the data is stored as the previously transmitted data subsequent to the inverting by feeding back the data being transmitted in the transmitting.

2. The method of claim 1, further comprising:
    setting a specific bit of an address signal as a control bit, wherein the at least one bit of data that is to be transmitted are inverted according to the control bit.

3. The method of claim 2, wherein the address signal is a column address strobe signal.

4. The method of claim 3, wherein the inverting of the at least one bit of the data that is to be transmitted comprises:
    comparing the stored previously transmitted data with the data that is to be transmitted; and
    inverting the at least one bit of the data that is to be transmitted if the number of bit transitions between the stored previously transmitted data and the data that is to be transmitted exceeds the reference number.

5. The method of claim 4, wherein the reference number is half a total number of bits of one of the stored data and the data that is to be transmitted.

6. A data transmitting apparatus comprising:
    an inversion determining unit which inverts at least one bit of data that is to be transmitted if a number of bit transitions between stored previously transmitted data and the data that is to be transmitted of sequentially transmitted data exceeds a reference number;
    an inversion indicating unit which indicates in a data strobe signal of a plurality of data strobe signals that the at least one bit of data that is to be transmitted is inverted;
    a transmitting unit which transmits the data strobe signal and the data of which the at least one bit is inverted; and
    a buffer which stores the data as the previously transmitted data, wherein the data to be stored is fed back upon transmitting by the transmitting unit.

7. The apparatus of claim 6, further comprising:
    a control bit setting unit which sets a specific bit of an address signal as a control bit,
    wherein the at least one bit of the data that is to be transmitted are inverted according to the control bit.

8. The apparatus of claim 7, wherein the address signal is a column address strobe signal.

9. The apparatus of claim 8, wherein the inversion determining unit comprises:
    a comparator which compares the stored previously transmitted data with the data that is to be transmitted; and
    an inverter which inverts the at least one bit of the data that is to be transmitted if the number of bit transitions between the stored previously transmitted data and the data that is to be transmitted exceeds the reference number.

10. The apparatus of claim 9, wherein the reference number is half a total number of bits of one of the stored data and the data that is to be transmitted.

11. A method of transmitting data in a semiconductor system, the method comprising:
    inverting, by a first device, at least one bit of data that is to be transmitted if a number of bit transitions of stored previously transmitted data and the data that is to be transmitted of sequentially transmitted data exceeds a reference number;
    indicating in a data strobe signal of a plurality of data strobe signals that the at least one bit of data that is to be transmitted is inverted, by the first device;
    transmitting the data strobe signal and the data of which the at least one bit is inverted, by the first device; and
    if a second device receives the data strobe signal and the data transmitted by the first device, inverting the at least one bit of the received data again based on the received data strobe signal, by the second device,
    wherein the data is stored as the previously transmitted data, by the first device, subsequent to the inverting by feeding back the data being transmitted in the transmitting.

12. The method of claim 11, further comprising:
    setting, by the first device, a specific bit of an address signal as a control bit,
    wherein the first device inverts the at least one bit of the data that is to be transmitted according to the control bit.

13. The method of claim 12, wherein the address signal is a column address strobe signal.

14. The method of claim 13, wherein the inverting of the at least one bit of the data that is to be transmitted comprises:

comparing the stored previously transmitted data with the data that is to be transmitted, by the first device; and inverting, by the first device, the at least one bit of the data that is to be transmitted if the number of bit transitions between the stored previously transmitted data and the data that is to be transmitted exceeds the reference number.

15. The method of claim 11, wherein if a memory controller transmits a write command to a semiconductor memory device, the first device is included in the memory controller, and the second device is included in the semiconductor memory device.

16. The method of claim 11, wherein if a memory controller transmits a read command to the semiconductor memory device, the first device is included in the semiconductor memory device, and the second device is included in the memory controller.

17. A data transmitting system comprising:
a first device comprising:
an inversion determining unit which inverts at least one bit of data that is to be transmitted if a number of bit transitions between stored previously transmitted data and the data that is to be transmitted of sequentially transmitted data exceeds a reference number;
an inversion indicating unit which indicates that the at least one bit of the data that is to be transmitted is inverted in a data strobe signal of a plurality of data strobe signals;
a transmitting unit which transmits the data strobe signal and the data of which the at least one bit is inverted; and
a buffer which stores the data as the previously transmitted data, wherein the data to be stored is fed back upon transmitting by the transmitting unit; and a second device comprising:
a first inverter which inverts the at least one bit of the received data again based on the received data strobe signal.

18. The system of claim 17, wherein the first device further comprises: a control bit setting unit which sets a specific bit of an address signal as a control bit,
wherein the first device inverts the at least one bit of the data that is to be transmitted according to the control bit.

19. The system of claim 18, wherein the address signal is a column address strobe signal.

20. The system of claim 19, wherein the inversion determining unit comprises:
a comparator which compares the stored previously transmitted data with the data that is to be transmitted; and
a second inverter which inverts the at least one bit of the data that is to be transmitted if the number of bit transitions between the stored previously transmitted data and the data that is to be transmitted exceeds the reference number.

21. The system of claim 17, wherein if a memory controller transmits a write command to a semiconductor memory device, the first device is included in the memory controller, and the second device is included in the semiconductor memory device.

22. The system of claim 17, wherein if a memory controller transmits a read command to the semiconductor memory device, the first device is included in the semiconductor memory device, and the second device is included in the memory controller.

* * * * *